United States Patent
San et al.

(10) Patent No.: US 8,008,177 B2
(45) Date of Patent: Aug. 30, 2011

(54) METHOD FOR FABRICATING SEMICONDUCTOR DEVICE USING A NICKEL SALICIDE PROCESS

(75) Inventors: Min-chul San, Busan Metropolitan (KR); Ja-hum Ku, Seongnam (KR); Chul-sung Kim, Seongnam (KR); Kwan-jong Roh, Anyang (KR); Min-joo Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1389 days.

(21) Appl. No.: 10/621,292

(22) Filed: Jul. 17, 2003

(65) Prior Publication Data

US 2004/0097060 A1  May 20, 2004

(30) Foreign Application Priority Data

Nov. 19, 2002 (KR) .................... 10-2002-0072094

(51) Int. Cl.
*H01L 21/28* (2006.01)
(52) U.S. Cl. ........ 438/581; 438/583; 438/658; 438/664; 438/682
(58) Field of Classification Search .......... 438/682, 438/683, 581, 583, 658, 664
See application file for complete search history.

(56) References Cited

U.S. PATENT DOCUMENTS

| 5,196,360 | A  | * | 3/1993  | Doan et al.     | 438/586 |
| 5,766,997 | A  | * | 6/1998  | Takeuchi        | 438/257 |
| 6,503,840 | B2 | * | 1/2003  | Catabay et al.  | 438/694 |
| 6,664,166 | B1 | * | 12/2003 | Jaiswal et al.  | 438/382 |
| 6,775,046 | B2 | * | 8/2004  | Hill et al.     | 359/288 |
| 2002/0151170 | A1 | * | 10/2002 | Maex et al.  | 438/638 |

FOREIGN PATENT DOCUMENTS

| JP | 07-038104  | 2/1995  |
| JP | 7038104    | 2/1995  |
| JP | 07-094449  | 4/1995  |
| JP | 2002-319552 | 10/2002 |
| WO | WO02056359 | 7/2002  |

* cited by examiner

*Primary Examiner* — Thanh V Pham
(74) *Attorney, Agent, or Firm* — F. Chau & Associates, LLC

(57) ABSTRACT

A method for fabricating a semiconductor device is provided using a nickel salicide process. The method includes forming a gate pattern and a source/drain region on a silicon substrate, forming a Ni-based metal layer for silicide on the silicon substrate where the gate pattern and the source/drain region are formed, and forming an N-rich titanium nitride layer on the Ni-based metal layer for silicide. Next, a thermal treatment is applied to the silicon substrate where the Ni-based metal layer for silicide and the N-rich titanium nitride layer are formed, thereby forming a nickel silicide on each of the gate pattern and the source/drain region. Then, the Ni-based metal layer for silicide and the N-rich titanium nitride layer are selectively removed to expose a top portion of a nickel silicide layer formed on the gate pattern and the source/drain region. Thus, as the N-rich titanium nitride layer is formed on the Ni-based metal layer for silicide, a silicide residue is prevented from forming a spacer and a field region formed of a field oxide layer.

20 Claims, 8 Drawing Sheets

METHOD FOR FABRICATING SEMICONDUCTOR DEVICE USING A NICKEL SALICIDE PROCESS

CROSS-REFERENCE TO RELATED APPLICATION

This application claims priority to Korean Patent Application No. 2002-72094, filed on Nov. 19, 2002.

BACKGROUND OF THE INVENTION

1. Technical Field

The present invention relates to methods for fabricating semiconductor devices, and more particularly, to a method for fabricating a semiconductor device using a nickel salicide process.

2. Discussion of the Related Art

As integration density and operational speed of semiconductor devices increase, materials having low resistivity are more widely used in semiconductor devices to reduce signal delay. There has been an increased interest in a silicide material having very low resistivity for lowering sheet resistance and contact resistance of a gate pattern and a source/drain region of a transistor. A silicide process has been applied to form a silicide layer on a gate pattern and a source/drain region of a transistor.

The salicide process typically uses cobalt for a silicide material. However, as the gate width of a semiconductor device is reduced to 100 nm or less, the cobalt salicide process has several problems. As denoted by reference numeral A of FIG. 1A, cobalt silicide formed on a gate pattern is either shorted or cut. Also, as denoted by reference numeral B of FIG. 1B, a pit is formed in a boundary area between an active region and a field region. In addition, as the gate width of a semiconductor device is reduced to 100 nm or less, the cobalt salicide process leads to the lumping of cobalt silicide.

The foregoing problems result from a high-temperature thermal treatment for changing cobalt silicide from CoSi-type to CoSi$_2$-type. Accordingly, there have been proposals to use a nickel salicide process in highly integrated semiconductor devices. This process requires no high-temperature thermal treatment. However, the nickel salicide process causes a silicide residue to form on a spacer and a field region and a field oxide layer formed on a silicon substrate.

Therefore, a need exists for fabricating a semiconductor device using a nickel salicide process that prevents a silicide residue from forming on a spacer and a field region.

SUMMARY OF THE INVENTION

The present invention provides a method for fabricating a semiconductor device using a nickel salicide process, which prevents a silicide residue from forming on a spacer and a field region such as a field oxide layer.

In accordance with one aspect of the present invention, a method for fabricating a semiconductor device is provided comprising the steps of forming a gate pattern and a source/drain region on a silicon substrate, forming a Ni-based metal layer for silicide on the silicon substrate where the gate pattern and the source/drain region are formed, and forming an N-rich titanium nitride layer on the Ni-based metal layer for silicide. Next, a thermal treatment is applied to the silicon substrate including the Ni-based metal layer for silicide and the N-rich titanium nitride layer to form a nickel silicide layer on the gate pattern and the source/drain region. Then, the Ni-based metal layer for silicide and the N-rich titanium nitride layer are selectively removed to expose a top portion of the nickel silicide formed on the gate pattern and the source/drain region.

The Ni-based metal layer for silicide can be formed at a temperature of about 25° C. to about 500° C. The Ni-based metal layer for silicide is preferably formed of nickel or a nickel alloy. The Ni-based metal layer for silicide can be formed of a nickel layer including 0 to about 20 at % of Ta, Zr, Ti, Hf, W, Co, Pt, Pd, V, Nb, or any combination thereof. The nitrogen-to-titanium (N/Ti) ratio of the N-rich titanium nitride layer preferably ranges from about 0.5 to about 2.

According to the present invention, when a semiconductor device is fabricated using a nickel salicide process as described above, a titanium nitride layer is formed on a Ni-based metal layer for silicide that prevents a silicide residue from forming on a spacer and a field region. Preferably, the field region is a field oxide layer.

DETAILED DESCRIPTION OF PREFERRED EMBODIMENTS

Figure 1A:
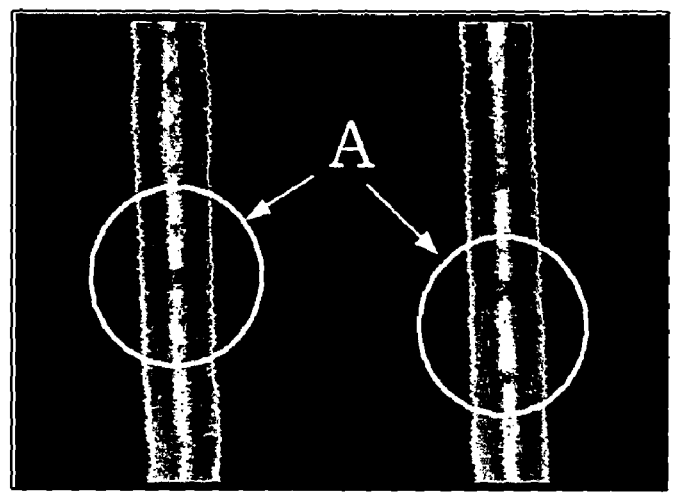
FIGS. 1A and 1B are SEM photographs of a semiconductor device fabricated using a conventional cobalt salicide process.
Figure 1B:
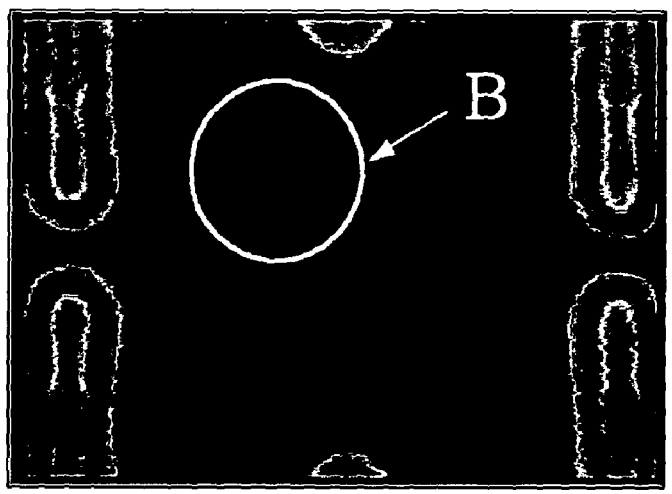

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, the shape of elements is exaggerated for clarity, and the same reference numerals in different drawings represent the same elements. Further, it will be understood that when a layer is referred to as being "on" another layer or substrate, it can be directly on the other layer or substrate, or intervening layers may also be present.

FIGS. 2A through 2D are cross-sectional views illustrating a method for fabricating a semiconductor device using a nickel salicide process according to an embodiment of the present invention. FIG. 3 is a flowchart illustrating the method for fabricating a semiconductor device as shown in FIGS. 2A through 2D.

Figure 2A:
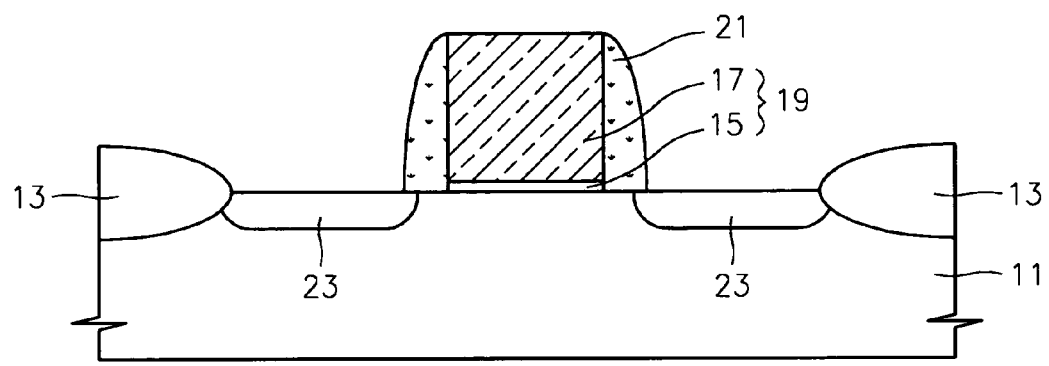
FIGS. 2A through 2D are cross-sectional views illustrating a method for fabricating a semiconductor device using a nickel salicide process according to an embodiment of the present invention.
Figure 3:
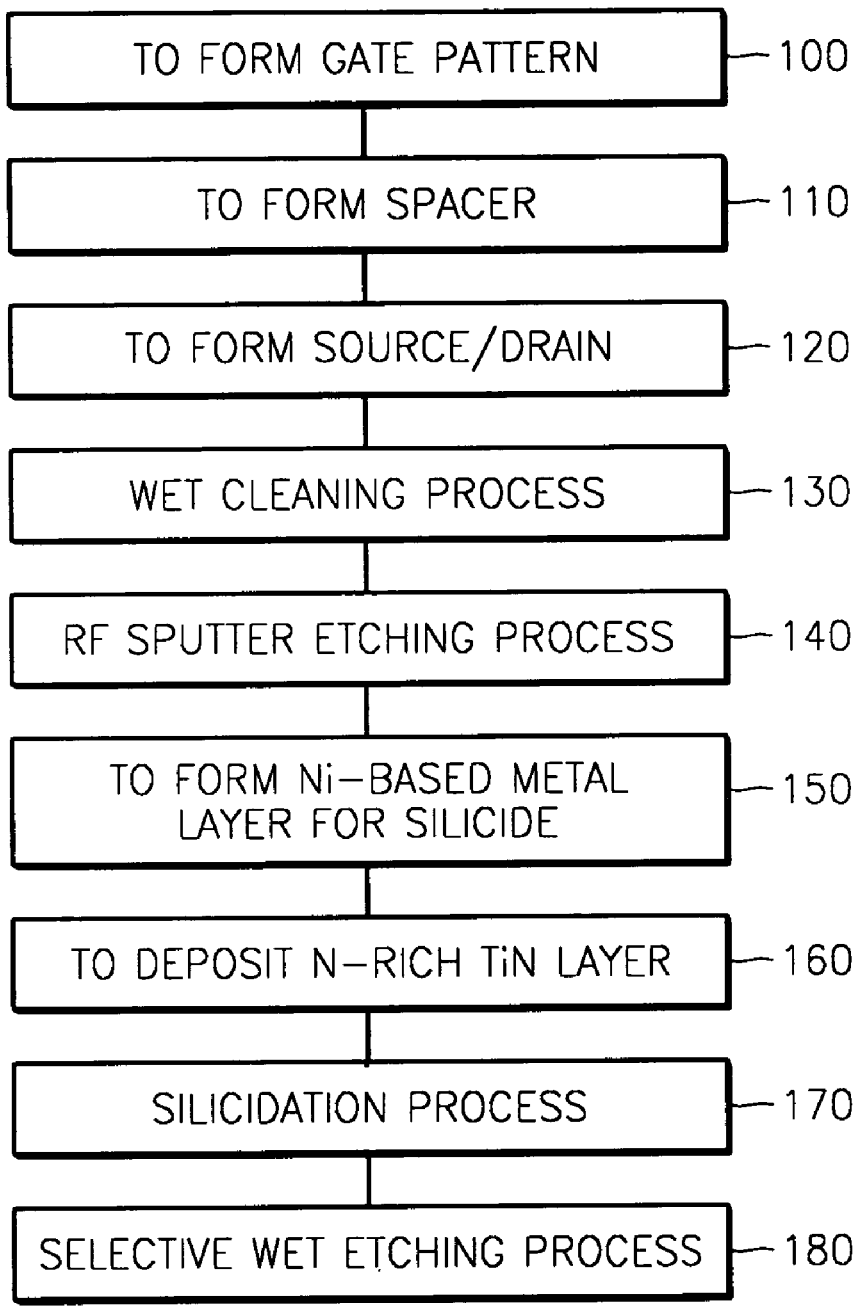
FIG. 3 is a flowchart illustrating the method for fabricating a semiconductor device as shown in FIGS. 2A through 2D.

Referring to FIG. 2A, a field region 13 is formed on a silicon substrate 11, for example, a p-type or n-type silicon substrate, to define an active region. Preferably, the field region 13 is a field oxide layer. Next, a gate pattern 19 is formed on the active region. The gate pattern 19 is formed of a gate insulating layer 15 and a gate electrode 17. Preferably, the gate insulating layer 15 is an oxide layer, and the gate electrode 17 is a polysilicon layer doped with impurity ions (Step 100).

Next, a spacer 21 is formed on both sidewalls of the gate pattern 19. The spacer 21 is formed by forming an insulating layer, such as a nitride layer, on the entire surface of the silicon substrate 11 including the gate pattern 19. Then, a etching process is performed forming spacers 21 on both sides of the gate pattern 19 (Step 110).

Impurity ions are implanted into the silicon substrate 11 to be aligned with the spacer 21, thereby forming a source/drain region 23. If the silicon substrate 11 is a p-type substrate, n-type impurity ions are implanted. Inversely, if the silicon substrate 11 is an n-type substrate, p-type impurity ions are implanted. As a result of the process steps of FIG. 2A, an n-MOS transistor or p-MOS transistor is formed (Step 120).

Figure 2B:
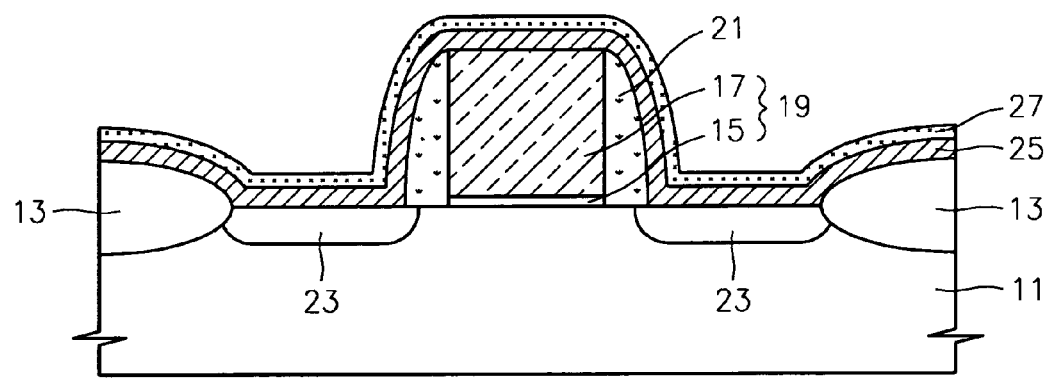

Referring to FIG. 2B, a wet cleaning process is applied to the silicon substrate 11 where the source/drain region 23, the spacer 21, and the gate pattern 19 are formed (Step 130).

The silicon substrate 11 is then etched using an RF sputter etching process to remove particles from the silicon substrate 11 (Step 140). However, the sputter etching process does not have to be applied to the silicon substrate 11.

A Ni-based metal layer 25 for silicide is formed on the entire surface of the silicon substrate 11 including the spacer 21 and gate pattern 19. The Ni-based metal layer 25 for silicide is nickel or a nickel alloy. Alternatively, the Ni-based metal layer 25 for silicide is a nickel layer including 0 to about 20 at % of Ta, Zr, Ti, Hf, W, Co, Pt, Pd, V, Nb, or any combination thereof. The Ni-based metal layer 25 for silicide is formed at a temperature of about 25° C. to about 500° C. (Step 150).

Next, an N-rich titanium nitride layer 27 is formed on the Ni-based metal layer 25 for silicide. To form the N-rich titanium nitride layer 27, the silicon substrate 11 where the Ni-based metal layer 25 for silicide is formed is loaded into a chamber, and then a nitrogen gas and a titanium source gas are injected into the chamber. Preferably, the nitrogen gas is injected at a flow rate of about 30 to about 120 sccm (standard cubic centimeter per minute). The N-rich titanium nitride layer 27 is formed at a temperature of about 25° C. to about 400° C. The resultant N-rich titanium nitride layer 27 has a nitrogen-to-titanium (N/Ti) ratio of about 0.5 to about 2. The N-rich titanium nitride layer 27 formed, as described above, prevents a silicide residue from forming on the spacer 21 and the field region 13 (Step 160).

The RF sputter etching process (Step 140), the formation of the Ni-based metal layer 25 for silicide, and the formation of the N-rich titanium nitride layer 27 can be achieved in-situ.

Figure 2C:
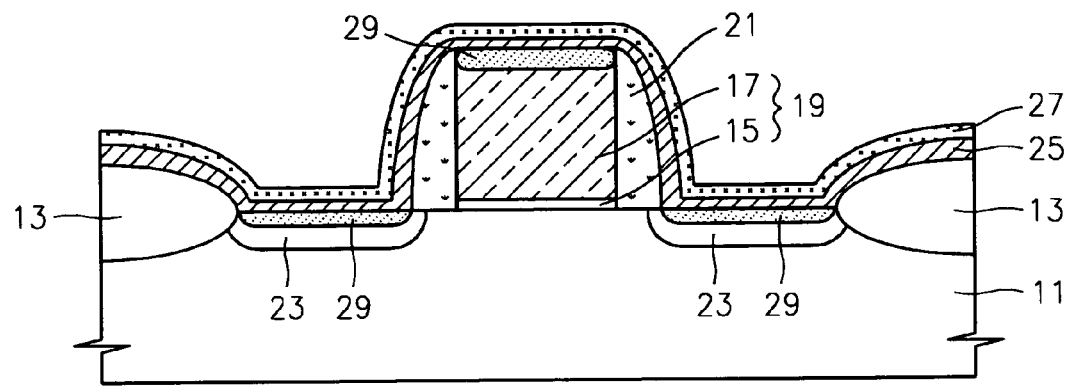

Referring to FIG. 2C, a thermal treatment is applied to the silicon substrate 11 where the Ni-based metal layer 25 for silicide and the N-rich titanium nitride layer 27 are formed, thereby proceeding with a silicidation process. Thus, nickel reacts with silicon to form a nickel silicide layer 29 on the gate pattern 19 and the source/drain region 23. The thermal treatment for forming the nickel silicide layer 29 is carried out using a rapid thermal treatment system, a furnace, a sputter system, or any combination thereof. The thermal treatment for forming the nickel silicide layer 29 is performed at a temperature of about 200° C. to about 700° C. (Step 170).

Figure 2D:
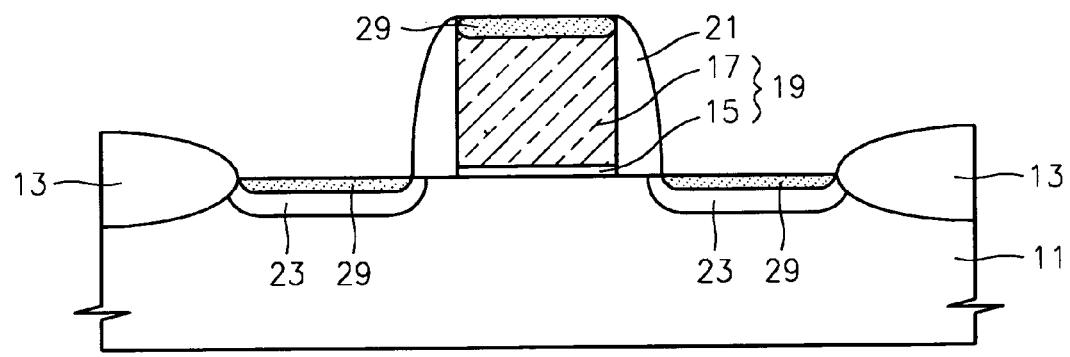

Referring to FIG. 2D, a wet cleaning process is applied to the silicon substrate 11 where the Ni-based metal layer 25 for silicide, the N-rich nitride layer 27, and the nickel silicide layer 29 are formed. Thus, the Ni-based metal layer 25 for silicide and the N-rich titanium nitride layer 27 are selectively removed exposing a top portion of the nickel silicide layer 29 formed on the gate pattern 19 and the source/drain region 23. As a result, the nickel silicide layer 29 is formed only on the gate pattern 19 and source/drain region 23. In particular, according to the present invention, a silicide residue is prevented from forming on the spacer 21 and the field region 13 (Step 180). Preferably, the field region 13 is a field oxide layer.

Figure 4A:
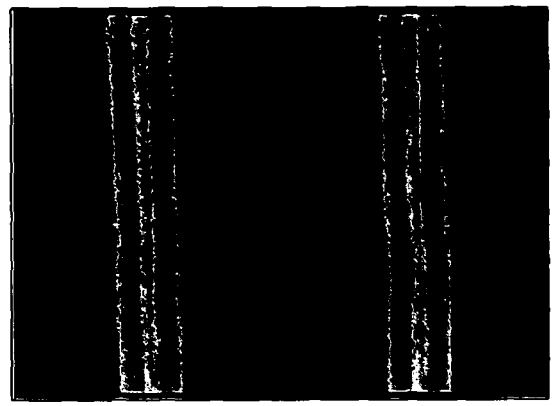
FIGS. 4A and 4B are SEM photographs of a semiconductor device fabricated using the nickel salicide process according to the present invention.
Figure 4B:
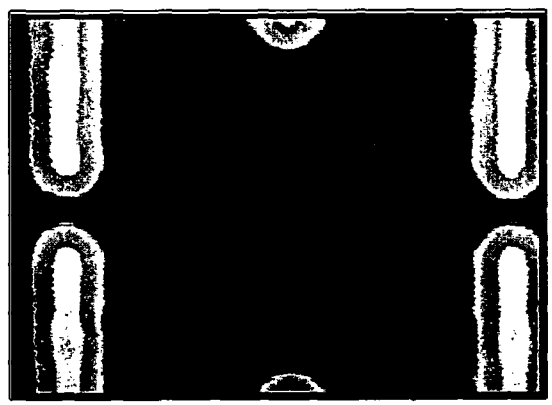

FIGS. 4A and 4B are SEM photographs of the semiconductor device fabricated using the nickel salicide process according to the present invention.

Specifically, in the case of the semiconductor device fabricated using the nickel salicide process according to the present invention, as shown in FIGS. 4A and 4B, the nickel silicide formed on the gate pattern is neither shorted nor cut. Further, unlike a conventional cobalt salicide process, the present invention prevents a pit from forming in a boundary area between the active region and the field region, and the nickel silicide is prevented from lumping.

FIGS. 5A through 5D are SEM photographs of the titanium nitride layer formed using the nickel salicide process according to the present invention, for different process conditions.

Figure 5A:
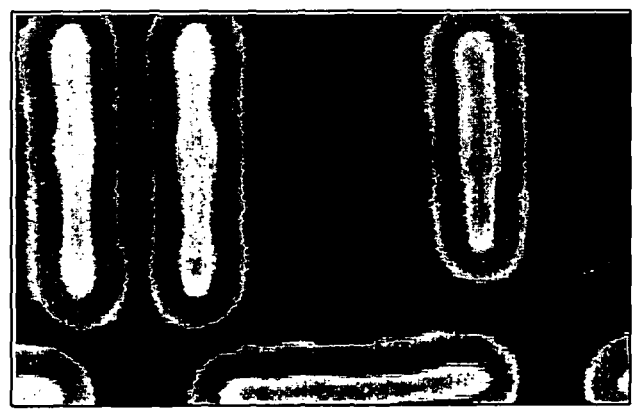
FIGS. 5A through 5D are SEM photographs of a titanium nitride layer formed using the nickel salicide process according to the present invention for different process conditions.
Figure 5B:
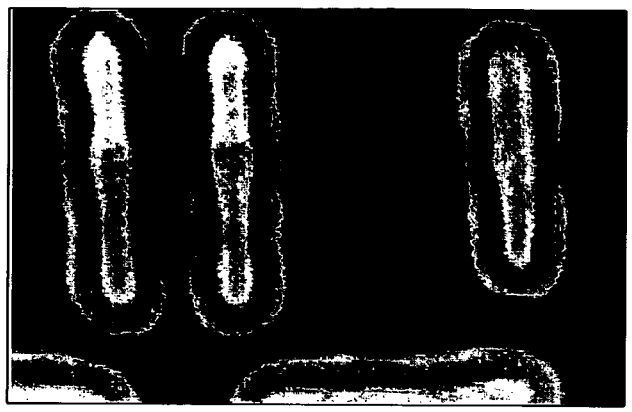
Figure 5C:
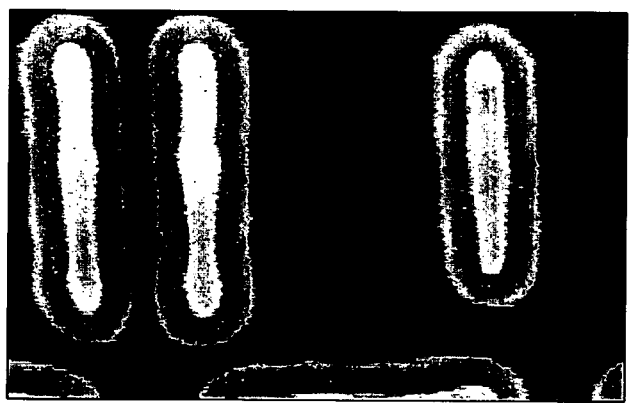

Specifically, FIG. 5A shows the case where the titanium nitride layer is formed by injecting a nitrogen gas at a flow rate of about 85 sccm and thermally treating at about 430° C. for approximately 30 seconds; FIG. 5B shows the case where the titanium nitride layer is formed by injecting a nitrogen gas at a flow rate of about 85 sccm and thermally treating at about 480° C. for approximately 30 seconds; FIG. 5C shows the case where the titanium nitride layer is formed by injecting a nitrogen gas at a flow rate of about 85 sccm and thermally treating at about 460° C. for approximately 30 seconds; and FIG. 5D shows the case where the titanium nitride layer is formed by injecting a nitrogen gas at a flow rate of about 30 sccm and thermally treating at about 460° C. for approximately 30 seconds.

Figure 5D:
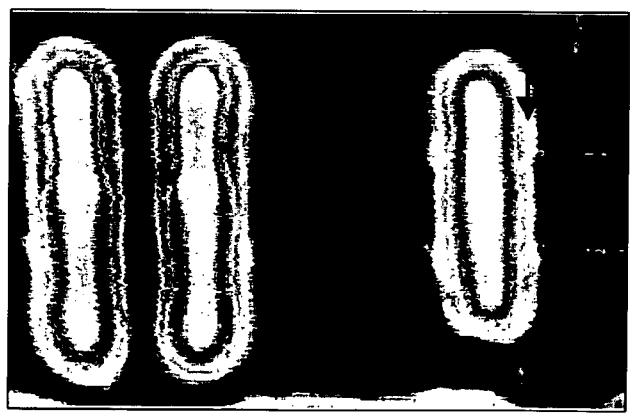

In FIG. 5D, a Ti-rich titanium nitride layer is formed on the Ni-based metal layer for silicide by injecting a nitrogen gas at the flow rate of about 30 sccm. Thus, as indicated by the arrows, a great amount of silicide residue forms on the field oxide layer and spacer. However, as shown in FIGS. 5A through 5C, if the N-rich titanium nitride layer is formed on the Ni-based metal layer for silicide by injecting a nitrogen gas at the flow rate of about 85 sccm, the silicide residue does not form even at the high temperature of about 480° C.

Figure 6A:
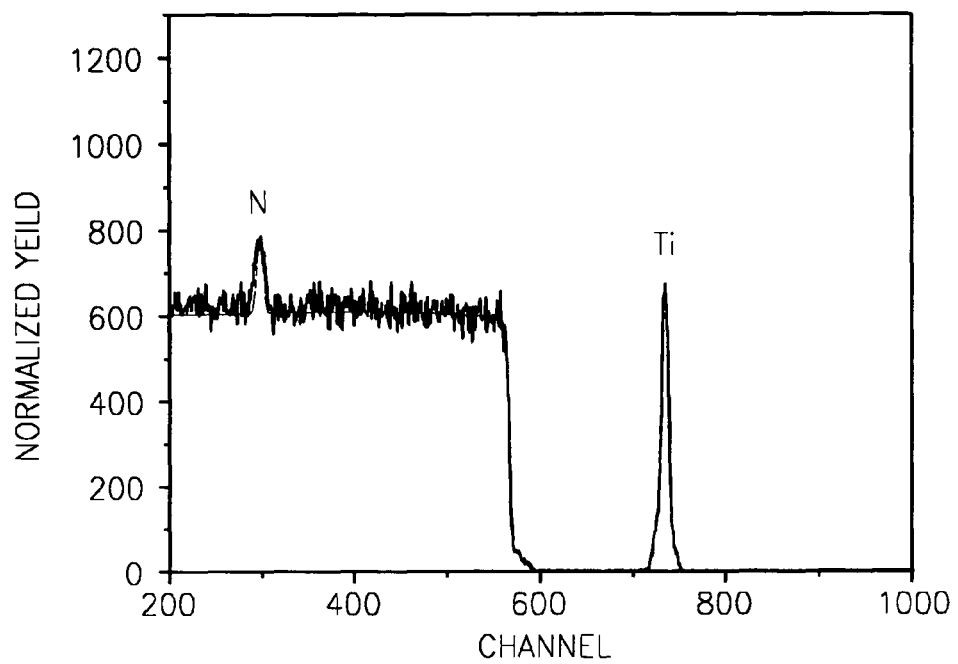
FIGS. 6A through 6C are RBS graphs concerning the titanium nitride layer formed using the nickel salicide process according to the present invention for different process conditions.
Figure 6B:
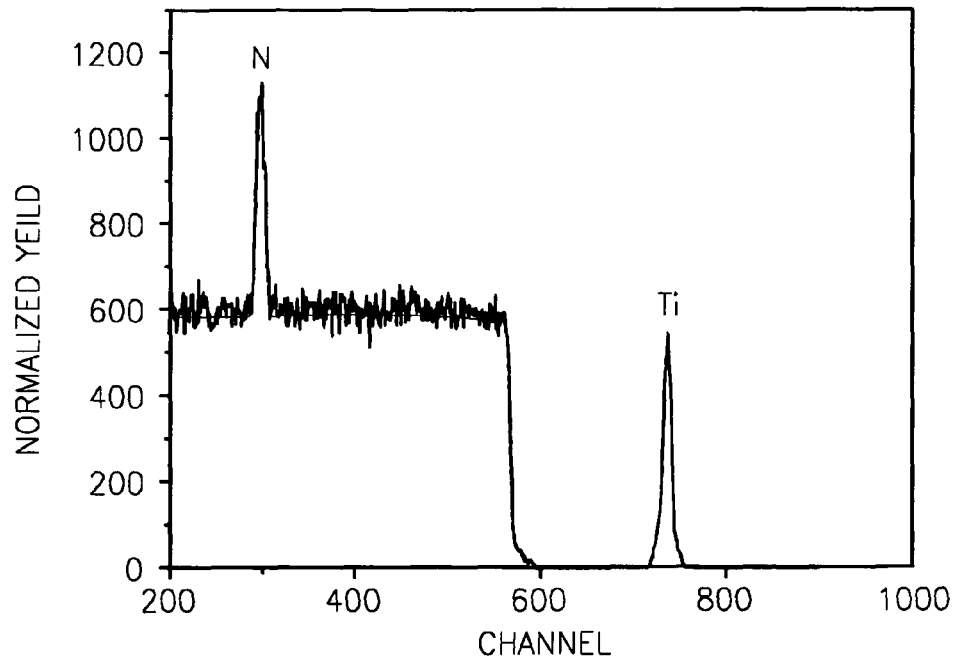
Figure 6C:
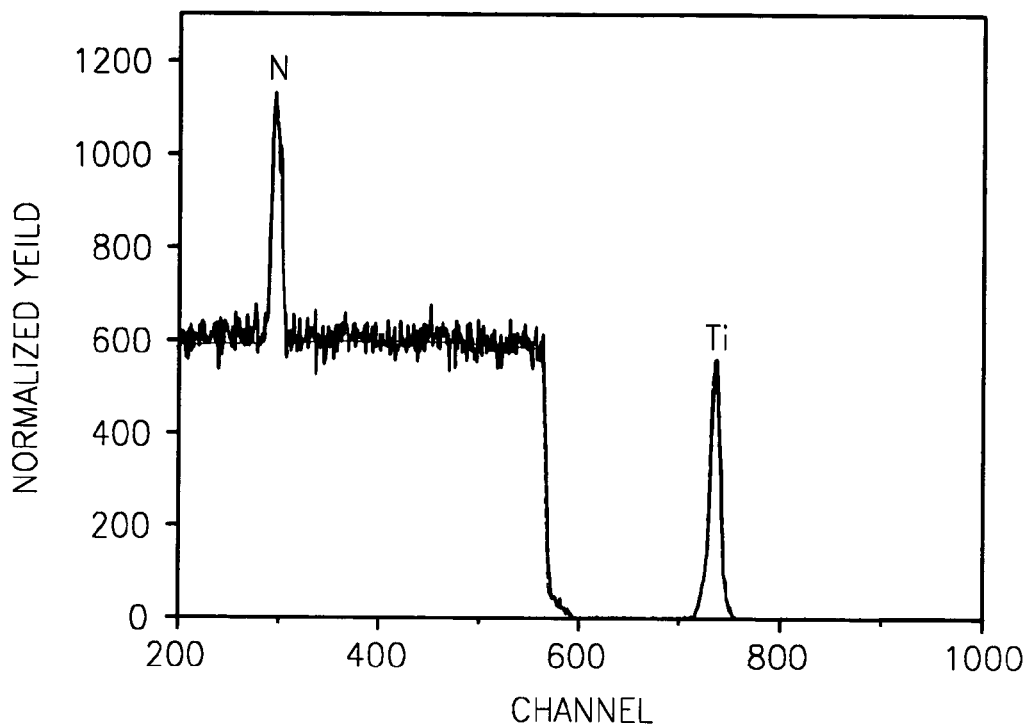

FIGS. 6A through 6C are Rutherford backscattering spectrometry (RBS) graphs concerning the titanium nitride layer formed using the nickel salicide process according to the present invention, for different process conditions.

In detail, FIGS. 6A through 6C show RBS analyses of the N/Ti ratio of the titanium nitride layer adopted in the present invention. Referring to FIGS. 6A through 6C, FIG. 6A shows the N/Ti ratio of about 0.3 for the Ti-rich titanium nitride layer, which was deposited by injecting a nitrogen gas at the flow rate of about 30 sccm. By contrast, FIGS. 6B and 6C show the N/Ti ratios of about 1.13 and about 1.15, respectively, e.g., more than 1, for the N-rich titanium nitride layer, which was deposited by injecting a nitrogen gas at the flow rate of about 85 sccm.

Figure 7:
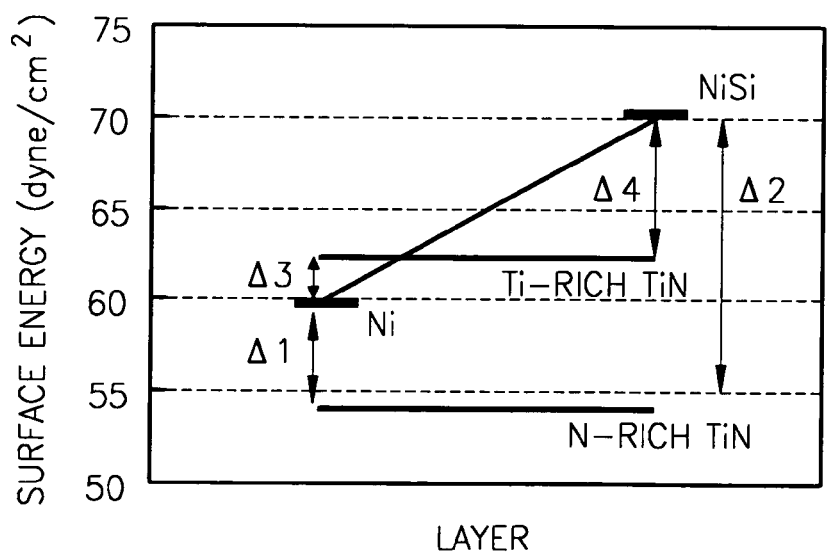
FIG. 7 is a graph showing measurements of surface energies of various layers during the nickel salicide process according to the present invention.

FIG. 7 is a graph showing measurements of surface energies of various layers during the nickel salicide process according to the present invention.

Referring to FIG. 7, measurements of surface energies of the nickel (Ni) layer, the nickel silicide (NiSi) layer, the Ti-rich titanium nitride layer, and the N-rich titanium nitride layer are shown. In FIG. 7, Δ1 is equal to a difference in the surface energy between the N-rich titanium nitride layer and the nickel layer, Δ2 is equal to a difference in the surface energy between the N-rich titanium nitride layer and the nickel silicide layer, Δ3 is equal to a difference in the surface energy between the Ti-rich titanium nitride layer and the nickel layer, and Δ4 is equal to a difference in the surface energy between the Ti-rich titanium nitride layer and the nickel silicide layer.

As shown in FIG. 7, since Δ4−Δ3<<Δ2−Δ1, when the N-rich titanium nitride layer is applied in place of the Ti-rich titanium nitride layer, an interface between the titanium nitride layer and the nickel layer is far more stable than that between the titanium nitride layer and the nickel silicide layer. Accordingly, when the N-rich titanium nitride layer is applied in place of the Ti-rich titanium nitride layer, a silicide retardation phenomenon occurs, preventing the generation of a silicide residue.

As explained above, a method according to the present invention of fabricating a semiconductor device using a nickel salicide process forms nickel silicide on the gate pattern which is neither shorted nor cut, and a pit is prevented from forming in a boundary area between the active region and field region. In addition, the nickel salicide process of the present invention prevents nickel silicide from lumping.

Further, according to the present invention, when a semiconductor device is fabricated, an N-rich titanium nitride layer is formed on the Ni-based metal layer for silicide. As a result, a silicide residue is prevented from forming on the spacer and the field region.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method for fabricating a semiconductor device comprising:
    forming a gate pattern and a source/drain region on a silicon substrate;
    forming a Ni-based metal layer comprised of a nickel alloy for silicide on the silicon substrate where the gate pattern and the source/drain region are formed;
    forming an N-rich titanium nitride layer on the Ni-based metal layer comprised of the nickel alloy for silicide;
    thermally treating the Ni-based metal layer comprised of the nickel alloy for silicide and the N-rich titanium nitride layer to form a nickel silicide layer on each of the gate pattern and the source/drain region; and
    selectively removing the Ni-based metal layer comprised of the nickel alloy for silicide and the N-rich titanium nitride layer to expose a top portion of the nickel silicide on the gate pattern and the source/drain region,
    whereby the nickel silicide on the gate pattern is neither shorted nor cut, and lumping of the nickel silicide is prevented, and wherein the Ni-based metal layer comprised of the nickel alloy for silicide is a nickel alloy layer including greater than 0 to about 20% of a material selected from the group consisting essentially of Ta, Zr, Ti, Hf, W, Pt, Pd, V, Nb, or any combination thereof.

2. The method as claimed in claim 1, wherein the Ni-based metal layer for silicide is formed at a temperature of about 25° C. to about 500° C.

3. The method as claimed in claim 1, wherein the N/Ti ratio of the N-rich titanium nitride layer ranges from about 0.5 to about 2.

4. The method as claimed in claim 1, wherein the thermal treatment for forming the nickel silicide layer is carried out using a rapid thermal treatment system, a furnace, a sputter system, or any combination thereof.

5. The method as claimed in claim 1, further comprises etching the silicon substrate using an RF sputter etching process to remove particles from the substrate after forming the source/drain.

6. The method as claimed in claim 5, wherein the RF sputter etching process comprises forming the Ni-based metal layer for silicide and the N-rich titanium nitride layer in-situ.

7. A method for fabricating a semiconductor device comprising:
    forming a field region on a substrate to define an active region;
    forming a gate pattern on the active region, wherein the gate pattern includes sidewalls;
    forming spacers on the sidewalls of the gate pattern;
    forming source/drain regions aligned with the spacers on both sides of the gate pattern;
    cleaning the substrate using a wet cleaning process;
    forming a Ni-based metal layer comprised of a nickel alloy for silicide on the entire surface of the substrate;
    forming a N-rich titanium nitride layer on the Ni-based metal layer comprised of the nickel alloy;
    thermally treating the Ni-based metal layer comprised of the nickel alloy for silicide and the N-rich titanium nitride layer to form a nickel silicide layer on the gate pattern and the source/drain region; and
    cleaning the substrate to selectively to remove the Ni-based metal layer comprised of the nickel alloy for silicide and the N-rich titanium nitride layer and to expose a top portion of the nickel silicide layer formed on the gate pattern and the source/drain region,
    whereby, the nickel silicide on the gate pattern is neither shorted nor cut, a pit is prevented from being formed in a boundary area between the active region and the field region, lumping of the nickel silicide is prevented, and a silicide residue is prevented from remaining on the spacers and the field region, and wherein the Ni-based metal layer comprised of the nickel alloy for silicide is a nickel alloy layer including greater than 0 to about 20% of a material selected from the group consisting essentially of Ta, Zr, Ti, Hf, W, Pt, Pd, V, Nb, or any combination thereof.

8. The method as claimed in claim 7, wherein the Ni-based metal layer for silicide is formed at a temperature of about 25° C. to about 500° C.

9. The method as claimed in claim 7, wherein the N/Ti ratio of the N-rich titanium nitride layer ranges from about 0.5 to about 2.

10. The method as claimed in claim 7, wherein the thermal treatment for forming the nickel silicide layer is carried out using a rapid thermal treatment system, a furnace, a sputter system, or any combination thereof.

11. The method as claimed in claim 7, further comprises etching the silicon substrate using an RF sputter etching process to remove particles from the substrate after forming the source/drain region.

12. A method for fabricating a semiconductor device comprising:
    forming a gate pattern and a source/drain region on a silicon substrate;

forming a Ni-based metal layer comprised of a nickel alloy for silicide at a temperature of about 25° C. to about 500° C. on the silicon substrate where the gate pattern and the source/drain region are formed;

forming an N-rich titanium nitride layer on the Ni-based metal layer comprised of the nickel alloy for silicide;

thermally treating the Ni-based metal layer comprised of the nickel alloy for silicide and the N-rich titanium nitride layer to form a nickel silicide layer on each of the gate pattern and the source/drain region; and selectively removing the Ni-based metal layer comprised of the nickel alloy for silicide and the N-rich titanium nitride layer, wherein a top portion of the nickel silicide on the gate pattern and the source/drain region is exposed, and wherein the Ni-based metal layer comprised of the nickel alloy for silicide is a nickel alloy layer including greater than 0 to about 20% of a material selected from the group consisting essentially of Ta, Zr, Ti, Hf, W, Pt, Pd, V, Nb, or any combination thereof.

13. The method as claimed in claim 12, wherein the N/Ti ratio of the N-rich titanium nitride layer ranges from about 0.5 to about 2.

14. A method for fabricating a semiconductor device comprising:

forming a field region on a substrate to define an active region;

forming a gate pattern on the active region, wherein the gate pattern includes sidewalls;

forming spacers on the sidewalls of the gate pattern;

forming source/drain regions aligned with the spacers on both sides of the gate pattern;

cleaning the substrate using a wet cleaning process;

etching the silicon substrate using an RF sputter etching process to remove particles from the substrate;

forming a Ni-based metal layer comprised of a nickel alloy for silicide on the entire surface of the substrate;

forming a N-rich titanium nitride layer on the Ni-based metal layer comprised of the nickel alloy;

thermally treating the Ni-based metal layer comprised of the nickel alloy for silicide and the N-rich titanium nitride layer to form a nickel silicide layer on the gate pattern and the source/drain region; and cleaning the substrate to selectively to remove the Ni-based metal layer comprised of the nickel alloy for silicide and the N-rich titanium nitride layer and to expose a top portion of the nickel silicide layer formed on the gate pattern and the source/drain region exposed, and wherein the Ni-based metal layer comprised of the nickel alloy for silicide is a nickel alloy layer including greater than 0 to about 20% of a material selected from the group consisting essentially of Ta, Zr, Ti, Hf, W, Pt, Pd, V, Nb, or any combination thereof.

15. The method as claimed in claim 14, wherein the N/Ti ratio of the N-rich titanium nitride layer ranges from about 0.5 to about 2.

16. The method of claim 1, wherein the nickel alloy layer includes greater than 0 to about 20% of only one of the materials of Ta, Zr, Hf, Pt, Pd, V, Nb, or any combination thereof.

17. The method of claim 7, wherein the nickel alloy layer includes greater than 0 to about 20% of only one of the materials of Ta, Zr, Hf, Pt, Pd, V, Nb, or any combination thereof.

18. The method of claim 12, wherein the nickel alloy layer includes greater than 0 to about 20% of only one of the materials of Ta, Zr, Hf, Pt, Pd, V, Nb, or any combination thereof.

19. The method of claim 14, wherein the nickel alloy layer includes greater than 0 to about 20% of only one of the materials of Ta, Zr, Hf, Pt, Pd, V, Nb, or any combination thereof.

20. A method for fabricating a semiconductor device comprising:

forming a gate pattern and a source/drain region on a silicon substrate;

forming a Ni-based metal layer comprised of a nickel alloy for silicide on the silicon substrate where the gate pattern and the source/drain region are formed;

forming an N-rich titanium nitride layer on the Ni-based metal layer comprised of the nickel alloy for silicide;

thermally treating the Ni-based metal layer comprised of the nickel alloy for silicide and the N-rich titanium nitride layer to form a nickel silicide layer on each of the gate pattern and the source/drain region; and selectively removing the Ni-based metal layer comprised of the nickel alloy for silicide and the N-rich titanium nitride layer to expose a top portion of the nickel silicide on the gate pattern and the source/drain region, whereby the nickel silicide on the gate pattern is neither shorted nor cut, and lumping of the nickel, silicide is prevented, and wherein the Ni-based metal layer comprised of the nickel alloy for silicide is a nickel alloy layer including greater than 0 to about 20% of a material selected from the group consisting essentially of Ta, Zr, Hf, Pt, Pd, V, Nb, or any combination thereof.

* * * * *